United States Patent
Liang et al.

(10) Patent No.: US 11,069,694 B2
(45) Date of Patent: Jul. 20, 2021

(54) SEMICONDUCTOR STRUCTURE AND METHOD FOR FORMING SAME

(71) Applicants: Semiconductor Manufacturing International (Shanghai) Corporation, Shanghai (CN); Semiconductor Manufacturing International (Beijing) Corporation, Beijing (CN)

(72) Inventors: Han Liang, Shanghai (CN); Wang Hai Ying, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 16/818,342

(22) Filed: Mar. 13, 2020

(65) Prior Publication Data

US 2021/0066326 A1    Mar. 4, 2021

(30) Foreign Application Priority Data

Aug. 30, 2019   (CN) .......................... 201910817749.8

(51) Int. Cl.
  *H01L 21/00*   (2006.01)
  *H01L 27/11524*   (2017.01)
  *H01L 21/28*   (2006.01)

(52) U.S. Cl.
  CPC .. *H01L 27/11524* (2013.01); *H01L 21/28185* (2013.01)

(58) Field of Classification Search
  CPC ................... H01L 27/11524; H01L 21/28185
  See application file for complete search history.

(56) References Cited

U.S. PATENT DOCUMENTS

| 2010/0210099 | A1* | 8/2010 | Hur | H01L 29/665 |
| | | | | 438/586 |
| 2012/0009770 | A1* | 1/2012 | Woo | H01L 27/11524 |
| | | | | 438/559 |
| 2021/0118893 | A1* | 4/2021 | Han | H01L 27/11521 |

* cited by examiner

*Primary Examiner* — Richard A Booth
(74) *Attorney, Agent, or Firm* — Brinks Gilson & Lione

(57) ABSTRACT

A semiconductor structure and a method for forming same are provided. In one form a method includes: providing a substrate with a discrete first gate laminated structure formed on the substrate; forming, on a portion of the substrate exposed from the first gate laminated structure, a unit dielectric layer covering a portion of a side wall of the first gate laminated structure, where the first gate laminated structure and the unit dielectric layer enclose a unit groove; forming an isolation spacer layer on a side wall of the unit groove, where the isolation spacer layer is in contact with the unit dielectric layer; forming a metal layer conformally covering the isolation spacer layer, the first gate laminated structure, and the unit dielectric layer; and annealing the metal layer to form a metal silicide layer. In implementations of the present disclosure, the metal layer is isolated from the first gate laminated structure at a bottom corner of the unit groove using the isolation spacer layer, to prevent a metal silicide layer from being formed at the bottom corner of the unit groove, so that the metal silicide layer is unlikely to have a protruded sharp portion, thereby increasing a breakdown voltage of a unit memory area. Therefore, electrical performance of the semiconductor structure is optimized.

12 Claims, 7 Drawing Sheets

SEMICONDUCTOR STRUCTURE AND METHOD FOR FORMING SAME

RELATED APPLICATIONS

The present application claims priority to Chinese Patent Appln. No. 201910817749.8, filed Aug. 30, 2019, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming same.

Related Art

Currently, flash memory has become the mainstream of a non-volatile memory (NVM). Flash memory may include NOR Flash memory and NAND Flash memory. Flash memory is generally characterized by a capability of storing information for a long time without power-on; having high integration and a fast access speed; and facilitating erasing and rewriting, etc., and it is therefore widely applied in many fields such as microcomputers, automation control, and so on.

Due to a relatively high unit density, a relatively high storage density, and fast writing and erasing speeds, NAND flash memory devices have gradually become a common-used structure in flash memories, and are currently mainly used in a flash card of digital cameras and the like and in MP3 players.

SUMMARY

A problem to be addressed in embodiments and implementations of the present disclosure is to provide a semiconductor structure and a method for forming same, so as to improve performance of the semiconductor structure.

One aspect of the present disclosure provides a method for forming a semiconductor structure. In one form, a method includes: providing a substrate including a unit memory area, and a plurality of discrete first gate laminated structures formed on the substrate of the unit memory area; forming a unit dielectric layer on a portion of the substrate exposed from a first gate laminated structure of the plurality of discrete first gate laminated structures, where a portion of a side wall of the first gate laminated structure is exposed from the unit dielectric layer, and the first gate laminated structure and the unit dielectric layer enclose a unit groove; forming an isolation spacer layer on a side wall of the unit groove, where a bottom of the isolation spacer layer is in contact with the unit dielectric layer, and a top of the isolation spacer layer is lower than a top of the first gate laminated structure; forming a metal layer conformally covering the isolation spacer layer, the first gate laminated structure, and the unit dielectric layer; and annealing the metal layer to form a metal silicide layer.

Another aspect of the present disclosure further provides a semiconductor structure. In one form, a semiconductor structure includes: a substrate including a unit memory area; a first gate laminated structure located on the substrate of the unit memory area; a unit dielectric layer located on a portion of the substrate exposed from the first gate laminated structure, where the unit dielectric layer covers a portion of a side wall of the first gate laminated structure, and the unit dielectric layer and the first gate laminated structure enclose a unit groove; an isolation spacer layer located on a side wall of the unit groove, where a bottom of the isolation spacer layer is in contact with the unit dielectric layer, and a top of the isolation spacer layer is lower than a top of the first gate laminated structure; and a metal layer conformally covers the first gate laminated structure, the isolation spacer layer, and the unit dielectric layer, where the metal layer is configured to form a metal silicide layer.

Compared to the prior art, technical solutions of embodiments and implementations of the present disclosure have the following advantages:

In embodiments and implementations of the present disclosure, the isolation spacer layer is formed on the side wall of the unit groove, to isolate the metal layer from the first gate laminated structure at a bottom corner of the unit groove, so that a metal silicide layer is unlikely to be formed on the side wall of the first gate laminated structure at the bottom corner of the unit groove during formation of a metal silicide layer through annealing, thereby preventing the metal silicide layer from being formed at the bottom corner of the unit groove. Correspondingly, the metal silicide layer is unlikely to have a protruded sharp portion, thereby helping increase a breakdown voltage of the unit memory area. Therefore, the electrical performance of the semiconductor structure can be improved.

DETAILED DESCRIPTION

Performance of a current NAND flash memory device may still be improved. Reasons why a device performance is poor is now analyzed in combination with a procedure of forming a semiconductor structure.

Figure 1:
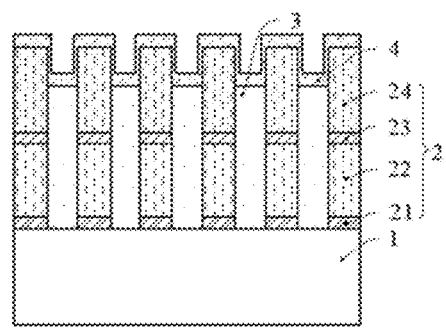
FIG. 1 and FIG. 2 are schematic structural diagrams of a procedure of forming a semiconductor structure.
Figure 2:
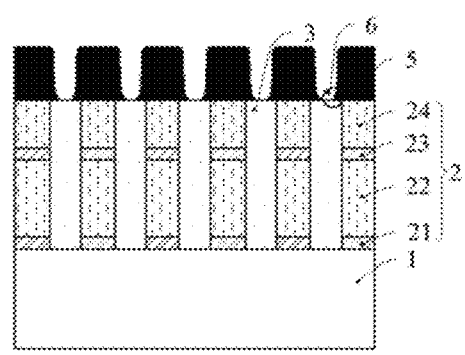
Figure 3:
FIG. 3 is an electron micrograph corresponding to a structure shown in FIG. 2.

FIG. 1 and FIG. 2 are schematic structural diagrams of a procedure of forming a semiconductor structure, and FIG. 3 is an electron micrograph corresponding to a structure shown in FIG. 2.

As shown in FIG. 1, a substrate 1 is provided. The substrate 1 includes a unit memory area (not labeled). A plurality of discrete gate laminated structures 2 are formed on the substrate 1 of the unit memory area. The gate laminated structure 2 includes a tunnel oxide layer 21, a floating gate 22 located on the tunnel oxide layer 21, an inter-gate dielectric layer 23 located on the floating gate 22, and a control gate 24 located on the inter-gate dielectric layer 23. A dielectric layer 3 is formed on the substrate 1 exposed from the gate laminated structure 2, the dielectric layer 3 covering a portion of a side wall of the control gate 24. A metal layer 4 conformally covering dielectric layer 3 and the gate laminated structure 2 is formed.

As shown in FIG. 2 and FIG. 3, FIG. 3 is an electron micrograph corresponding to the structure shown in FIG. 2. The metal layer 4 is silicided to form a metal silicide layer 5.

The metal layer 4 conformally covers the dielectric layer 3 and the gate laminated structure 2. The metal layer 4 is usually formed using a physical vapor deposition (PVD) process or an atomic layer deposition (ALD) process. The metal layer 4 on the dielectric layer 3 is likely to have a thickness greater than that of the metal layer 4 on a side wall of the gate laminated structure 2. Therefore, after the metal layer 4 is silicided to form the metal silicide layer 5, the metal silicide layer 5 at a corner between the dielectric layer 3 and the control gate 24 is likely to have a sharp portion 6 (shown in FIG. 2), that is, an area A shown FIG. 3. The sharp portion 6 is likely to lower a breakdown voltage of the unit memory area, resulting in poor electrical performance of the semiconductor structure.

To address the technical problems, in embodiments and implementations of the present disclosure, an isolation spacer layer is formed on a side wall of a unit groove, to isolate the metal layer from a first gate laminated structure at a bottom corner of the unit groove, so that a metal silicide layer is unlikely to be formed on a side wall of the first gate laminated structure at the bottom corner of the unit groove during formation of a metal silicide layer through annealing, thereby preventing the metal silicide layer from being formed at the bottom corner of the unit groove. Correspondingly, the metal silicide layer is unlikely to have a protruded sharp portion, thereby helping increase the breakdown voltage of the unit memory area. Therefore, the electrical performance of the semiconductor structure can be improved.

In order to make the foregoing objectives, features, and advantages of the embodiments and implementations of the present disclosure more apparent and easier to understand, specific embodiments and implementations of the present disclosure are described in detail below with reference to the accompanying drawings.

FIG. 4 to FIG. 10 are respective schematic structural diagrams of steps in one form of a method for forming a semiconductor structure.

Figure 4:
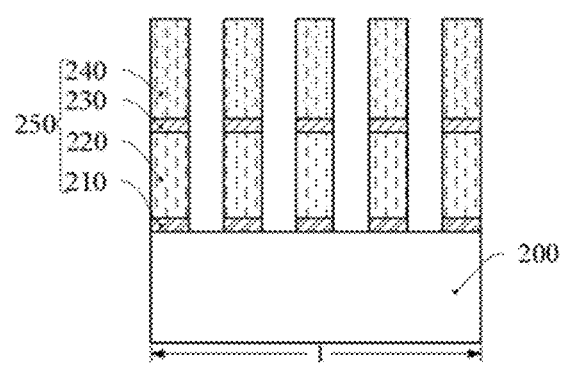
FIG. 4 to FIG. 10 are respective schematic structural diagrams of steps in one form of a method for forming a semiconductor structure.

Referring to FIG. 4, a substrate 200 is provided, the substrate 200 including a unit memory area I, and a plurality of discrete first gate laminated structures 250 formed on the substrate 200 of the unit memory area I.

The substrate 200 provides a process platform for subsequently forming a flash memory. In particular, the substrate 200 is configured to form a NAND flash memory device.

In some implementations, the substrate 200 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on the insulator.

In some implementations, the first gate laminated structure 250 includes a first gate insulating layer 210, a floating gate (FG) layer 220 located on the first gate insulating layer 210, a first gate dielectric layer 230 located on the floating gate layer 220, and a control gate (CG) layer 240 located on the first gate dielectric layer 230.

In some implementations, the first gate insulating layer 210 is a tunnel oxide layer of the NAND flash memory device, and the first gate insulating layer 210 is made of silicon oxide. The floating gate layer 220 is configured to store electrons during formation of the NAND flash memory, so that the NAND flash memory device can store data. The floating gate layer 220 is made of polysilicon, and the first gate dielectric layer 230 serves as an insulating layer between the floating gate layer 220 and the control gate layer 240. The control gate layer 240 serves as a part of a word line of the NAND memory, and the control gate 240 is made of polysilicon.

Figure 5:
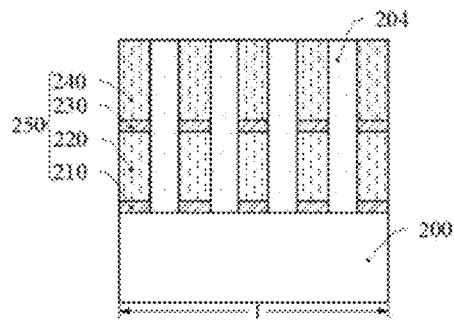
Figure 6:
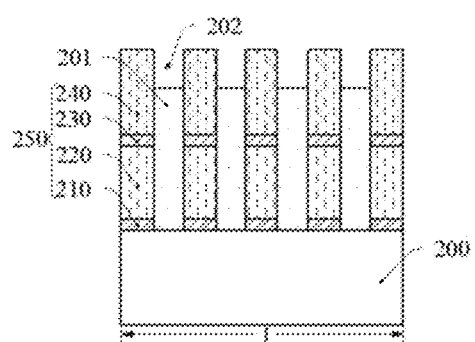

Referring to FIG. 5 and FIG. 6, a unit dielectric layer 201 (shown in FIG. 6) is formed on the substrate 200 exposed from the first gate laminated structure 250, a portion of a side wall of the first gate laminated structure 250 is exposed from the unit dielectric layer 201, and the first gate laminated structure 250 and the unit dielectric layer 201 enclose a unit groove 202 (shown in FIG. 6).

The unit dielectric layer 201 covers the portion of the side wall of the first gate laminated structure 250 for electrically isolating adjacent first gate laminated structures 250. The unit dielectric layer 201 is further configured to determine a location of the unit groove 202 for preparation of subsequent formation of an isolation spacer layer on a side wall of the unit groove 202.

In particular, the unit dielectric layer 201 covers a portion of a side wall of the control gate layer 240.

In some implementations, the unit dielectric layer 201 is made of at least one of silicon nitride, silicon carbonitride, silicon oxycarbonitride, silicon oxynitride, boron nitride, or boron carbonitride. In some implementations, a material of the bottom dielectric layer 201 includes silicon oxide.

The step of forming the unit dielectric layer 201 includes: forming a unit dielectric material layer 204 covering the first gate laminated structure 250 and the substrate 200; removing the unit dielectric material layer 204 higher than the first gate laminated structure 250; and after the unit dielectric material layer 204 higher than the first gate laminated structure 250 is removed, etching back a portion of the unit dielectric material layer 204 in thickness, a remainder of the unit dielectric material layer 204 located on the substrate 200 exposed from the first gate laminated structure 250 serves as the unit dielectric layer 201.

In some implementations, the unit dielectric material layer 204 is formed using a low pressure furnace tube process. In the low pressure furnace tube process, a process temperature and a process pressure are relatively low, helping reduce a thermal budget. In addition, in the low pressure furnace tube process, step performance is excellent, so that formed silicon oxide has relatively high quality and relatively good uniformity and flatness. In other implementations, an atomic layer deposition process may also be used.

In some implementations, the unit dielectric material layer 204 higher than the first gate laminated structure 250 is removed using a maskless etching process. A mask is not required in a step of the maskless etching process, so that process costs are reduced.

In some implementations, the portion of the unit dielectric material layer 204 is etched back in thickness still using the maskless etching process. A mask is not required in a step of etching back the portion of the unit dielectric material layer 204 in thickness, so that process costs are reduced. In addition, using the dry etching process facilitates precise control of a thickness by which the unit dielectric material layer 204 is removed.

Figure 7:
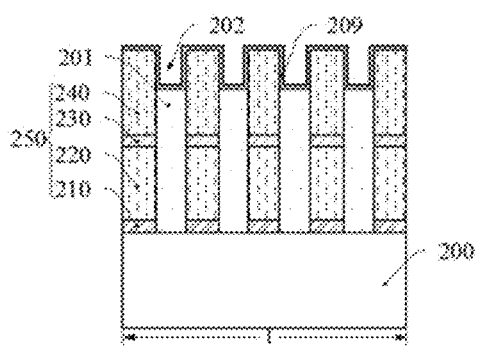
Figure 8:
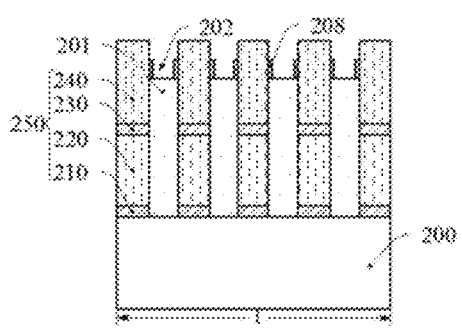

Referring to FIG. 7 and FIG. 8, an isolation spacer layer 208 (shown in FIG. 8) is formed on a side wall of the unit groove 202, a bottom of the isolation spacer layer 208 contacting with the unit dielectric layer 201, and a top of the isolation spacer layer 208 being lower than a top of the first gate laminated structure 250.

A metal layer conformally covering the isolation spacer layer 208, the first gate laminated structure 250, and the unit dielectric layer 201 is subsequently formed. In embodiments and implementations of the present disclosure, the metal layer is isolated from the first gate laminated structure 250 at a bottom corner of the unit groove 202 through the isolation spacer layer 208, so that a metal silicide layer is unlikely to be formed on the side wall of the first gate laminated structure 250 at the bottom corner of the unit groove during subsequent formation of a metal silicide layer through processing on the metal layer, thereby preventing the metal silicide layer from being formed at a corner between the first gate laminated structure 250 and the unit dielectric layer 201. Correspondingly, the metal silicide layer is unlikely to have a protruded sharp portion, thereby helping increase a breakdown voltage of the unit memory area I. Therefore, the electrical performance of the semiconductor structure can be improved.

In some implementations, the isolation spacer layer 208 is made of a dielectric material.

The isolation spacer layer 208 is made of at least one of silicon oxide, silicon nitride, silicon oxynitride, silicon carbide, silicon carbonitride, boron nitride, tetraethyl orthosilicate, boron nitride silicon, or boron carbon silicon nitride. In some implementations, a material of the isolation spacer layer 208 includes silicon oxide.

In particular, the step of forming the isolation spacer layer 208 includes:

forming an isolation spacer material layer 209 conformally covering the unit dielectric layer 201 and the first gate laminated structure 250, which is shown in FIG. 7.

The isolation spacer material layer 209 on the side wall of the first gate laminated structure 250 is configured to prepare for subsequently forming the isolation spacer layer.

In some implementations, the isolation spacer material layer 209 is formed using a low pressure furnace tube process, and the isolation spacer material layer 209 is made of silicon oxide. In a procedure of the low pressure furnace tube process, a process temperature and a process pressure are relatively low, helping reduce a thermal budget. In addition, in the low pressure furnace tube process, step performance is excellent, so that formed silicon oxide has relatively high quality and relatively good uniformity and flatness. In other implementations, the isolation spacer material layer may also be formed using an atomic layer deposition process, a low pressure chemical vapor deposition (LP-CVD) process, or a high temperature oxidation process.

As shown in FIG. 8, the isolation spacer material layers 209 on the unit dielectric layer 201 and on the top and a portion of the side wall of the first gate laminated structure 250 are removed using an anisotropic etching process, a remainder of the isolation spacer material layer 209 located on the side wall of the unit groove 202 serving as the isolation spacer layer 208.

In some implementations, the anisotropic etching process is a dry etching process. The dry etching process has characteristics of anisotropic etching, and has relatively good etch profile control. During removal of the isolation spacer material layers 209 on the unit dielectric layer 201 and on the top of the first gate laminated structure 250, a relatively small amount of the isolation spacer material layer 209 on the side wall of the first gate laminated structure 250 is etched, so that the isolation spacer material layer 209 on the portion of the side wall of the first gate laminated structure 250 can be removed.

The isolation spacer material layer 209 on the portion of the side wall of the first gate laminated structure 250 is easily removed through proper control of an etching time.

In particular, the isolation spacer material layers 209 on the unit dielectric layer 201 and on the top and the portion of the side wall of the first gate laminated structure 250 are removed using a maskless dry etching process. A mask is not required in the maskless etching process, so that process costs are reduced.

It should be noted that, in the unit memory area I, in a lateral direction perpendicular to a direction in which the isolation spacer layer 208 extends, a lateral dimension of a projection of the isolation spacer layer 208 on the unit dielectric layer 201 should be neither excessively large nor excessively small. If the lateral dimension is excessively large, the control gate layer 240 is likely to be damaged during removal of the isolation spacer material layer 209 on the top of the first gate laminated structure 250, resulting in poor electrical performance of the semiconductor structure. If the lateral dimension is excessively small, the isolation spacer layer 208 cannot completely isolate the subsequently formed metal layer from the first gate laminated structure 250 at the bottom corner of the unit groove 202. Consequently, a metal silicide layer subsequently formed at the corner is unlikely to have a protruded sharp portion, resulting in a relatively low breakdown voltage of the unit memory area I. Consequently, the electrical performance of the semiconductor structure is poor. In some implementations, the lateral dimension of the projection of the isolation spacer layer 208 on the unit dielectric layer 201 ranges from three nanometers to five nanometers.

It should be noted that the isolation spacer layer 208 should be neither excessively tall nor excessively short. After the metal layer covering the first gate laminated structure 250 is subsequently formed, the metal layer is annealed, so that metal silicide is not formed because the metal layer covering the side wall of the isolation spacer layer 208 does not react with the first gate laminated structure 250. If the isolation spacer layer 208 is excessively tall, excessive metal layers are likely to be formed on the isolation spacer layer 208, resulting in a formed metal silicide layer with an excessive small thickness. As a result, the semiconductor structure has a relatively large resistance, correspondingly resulting in poor electrical performance of the semiconductor structure. If the isolation spacer layer 208 is excessively short, the isolation spacer layer 208 cannot completely isolate the subsequently formed metal layer from the first gate laminated structure 250 at the bottom corner of the unit groove 202. Consequently, a protruded sharp portion is likely to appear as a result of the metal silicide layer formed at the corner, resulting in a relatively low breakdown voltage of the unit memory area I. Consequently, the electrical performance of the semiconductor structure is poor. In some implementations, a height of the isolation spacer layer 208 ranges from 20 nanometers to 30 nanometers.

Figure 9:
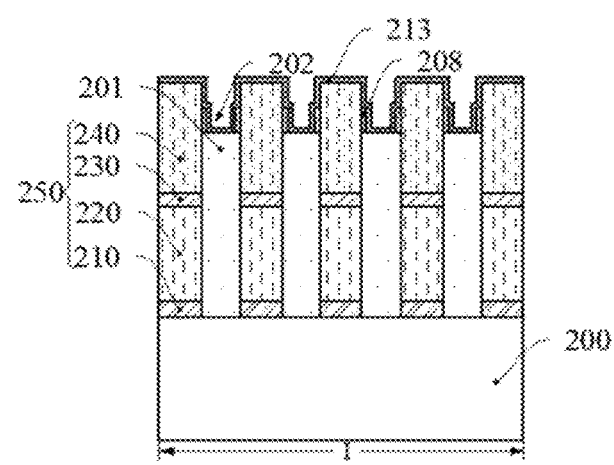

Referring to FIG. 9, a metal layer 213 conformally covering the isolation spacer layer 208, the first gate laminated structure 250, and the unit dielectric layer 201 is formed.

During subsequent annealing, the metal layer 213 reacts with the first gate laminated structure 250 to form a metal silicide layer.

In some implementations, the metal layer 213 is made of one or more of nickel, titanium, and cobalt.

In some implementations, the metal layer 213 is formed using an atomic layer deposition process. In the atomic layer deposition process, gap filling performance and step coverage are good, enhancing a conformal coverage capability of the metal layer 213. In other implementations, the metal layer may be formed using other deposition processes such as a physical vapor deposition process or the like.

Figure 10:
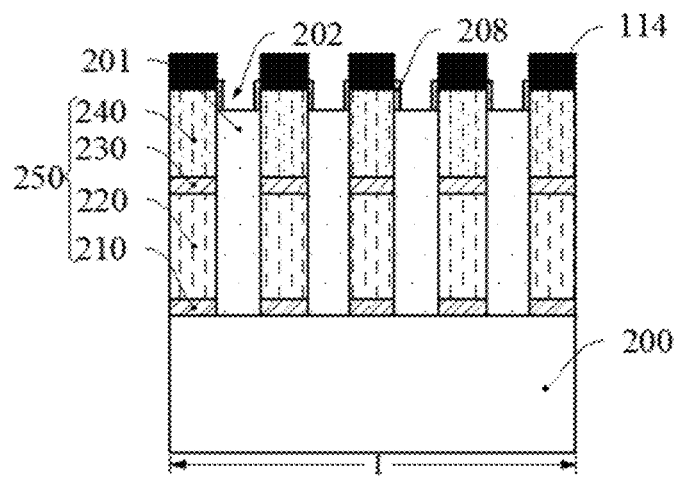

Referring to FIG. 10, the metal layer 213 (shown in FIG. 9) is annealed to form a metal silicide layer 214.

After the metal silicide layer 214 is formed, remaining control gate layer 240 and metal silicide layer 214 in the first gate laminated structure 250 serve as word lines of the NAND flash memory device.

A gate resistance of the NAND flash memory device is reduced through the metal silicide layer 214, thereby improving a programming operation capability and efficiency of the NAND flash memory device, improving a reread/rewrite capability of the NAND flash memory device, and reducing a resistance capacitance delay (RC) and improving performance of the NAND flash memory device.

In particular, during annealing, the metal layer 213 reacts with the control gate layer 240 covered by the metal layer, to convert a material of the exposed control gate layer 240 into a material of the metal silicide layer 214.

The method of forming a semiconductor structure further includes removing an unreacted remaining metal layer 213 after the metal silicide layer 214 the formed.

In some implementations, the metal layer 213 is made of one or more of nickel, titanium, and diamond. Correspondingly, the metal silicide layer 214 is made of one or more of a nickel silicon compound, a titanium silicon compound, and a cobalt silicon compound.

It should be noted that the isolation spacer layer 208 is made of a dielectric material. Therefore, the isolation spacer layer 208 may be retained, simplifying the process for forming the semiconductor structure.

FIG. 11 to FIG. 20 are respective schematic structural diagrams of steps in another form of a method for forming a semiconductor structure.

Details about similarities between implementations of the present disclosure described below and previously described implementations are not described herein again.

Figure 11:
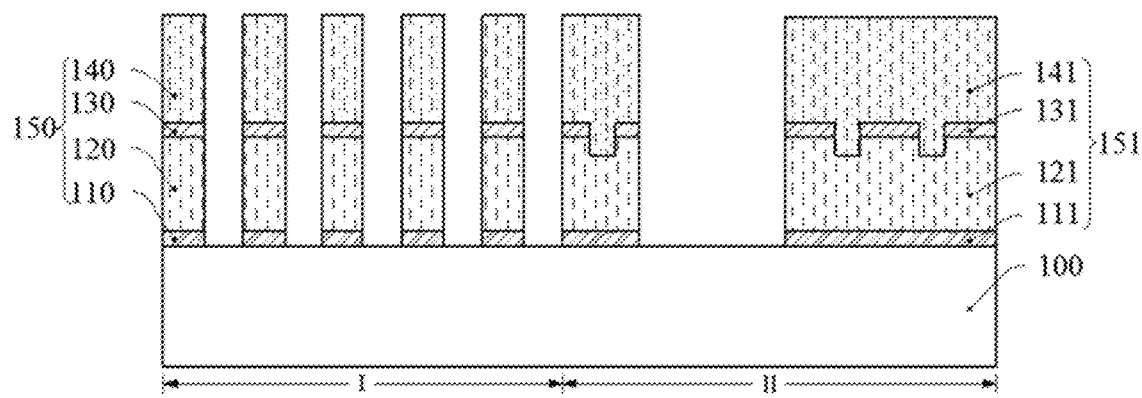
FIG. 11 to FIG. 20 are respective schematic structural diagrams of steps in another form of a method for forming a semiconductor structure.

Referring to FIG. 11, a substrate 100 is provided, the substrate 100 including a unit memory area I, and a plurality of discrete first gate laminated structures 150 being formed on the substrate 100 of the unit memory area I.

In some implementations, the substrate 100 is made of a material that is the same as that in the foregoing implementations, and therefore details are not described herein again.

In some implementations, the first gate laminated structure 150 includes a first gate insulating layer 110, a floating gate layer 120 located on the first gate insulating layer 110, a first gate dielectric layer 130 located on the floating gate layer 120, and a control gate layer 140 located on the first gate dielectric layer 130. For related descriptions of the first gate insulating layer 110, the floating gate layer 120, the first gate dielectric layer 130, and the control gate layer 140, refer to the foregoing implementations, as details are not described herein again.

It should be noted that the substrate 100 further includes a peripheral area II. A discrete second gate laminated structure 151 is formed on the substrate 100 of the peripheral area II. In particular, the second gate laminated structure 151 includes a select gate (SG) located on the substrate 100.

Through the select gate, during an erase operation of the NAND flash memory device, over-erase of the NAND flash memory device can be effectively avoided, thereby avoiding data misjudgment.

For this purpose, in some implementations, the second gate laminated structure 151 includes a second gate insulating layer 111 located on the substrate 100, a bottom polysilicon layer 121 on the second gate insulating layer 111, a second gate dielectric layer 131 located on the bottom polysilicon layer 121, and a top polysilicon layer 141 located on the second gate dielectric layer 131. The second gate dielectric layer 131 has an opening therein, a portion of the bottom polysilicon layer 121 being exposed from the opening, the top polysilicon 141 is located within the opening, and the top polysilicon layer 141 contacts with the bottom polysilicon layer 121 through opening. The top polysilicon layer 141, the second gate dielectric layer 131, and the bottom polysilicon layer 121 form the select gate.

It should be noted that, in order to reduce process steps, reduce a manufacturing time, and reduce costs, the first gate laminated structure 150 and the second gate laminated structure 151 are formed in a same process step.

It should be noted that, in some implementations, that the unit memory area I and the peripheral area II are adjacent areas is used as an example for description. In other implementations, the unit memory area and the peripheral area may also be isolated.

Figure 12:
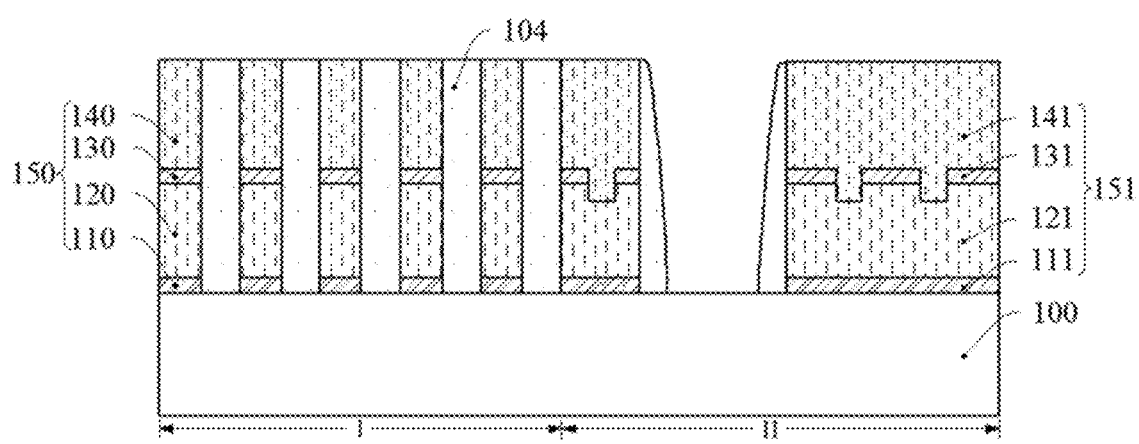
Figure 13:
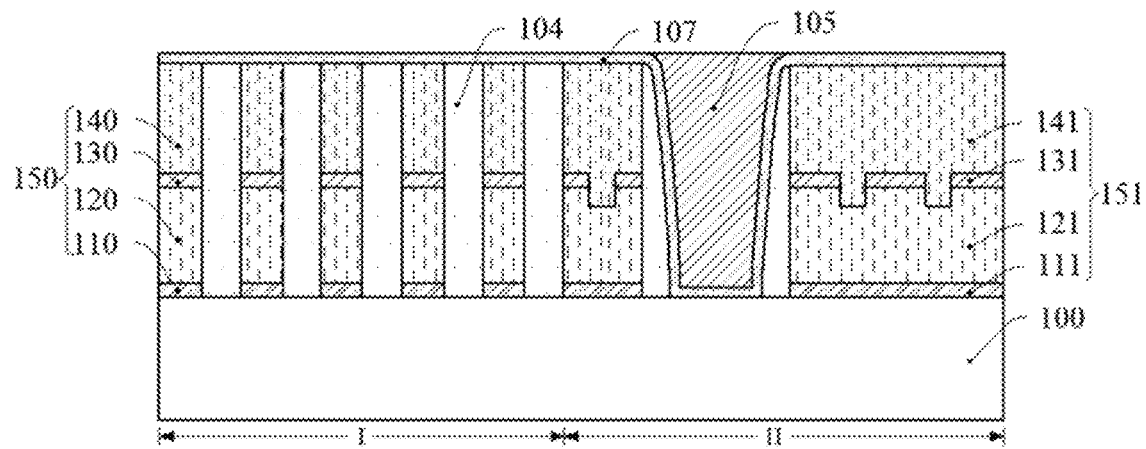
Figure 14:
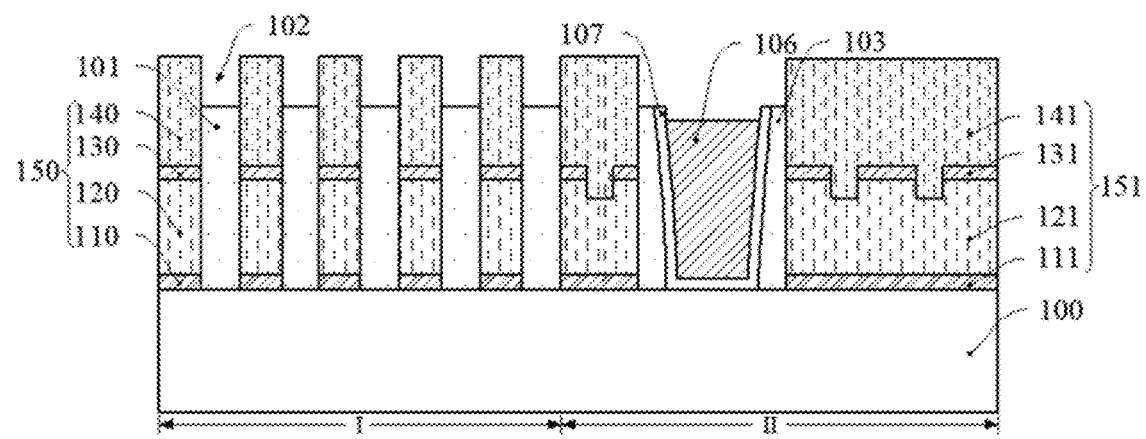

Referring to FIG. 12 to FIG. 14, a unit dielectric layer 101 (shown in FIG. 14) is formed on the substrate 100 exposed from the first gate laminated structure 150, a portion of a side wall of the first gate laminated structure 150 being exposed from the unit dielectric layer 101, and the first gate laminated structure 150 and the unit dielectric layer 101 enclosing a unit groove 102 (shown in FIG. 14).

In some implementations, during formation of the unit dielectric layer 101 on the substrate 100 exposed from the first gate laminated structure 150, the unit dielectric layer 101 is further formed on a side wall of the second gate laminated structure 151, the unit dielectric layer 101 on the side wall of the second gate laminated structure 151 serving as a spacer 103 (shown in FIG. 14), and a portion of the side wall of the second gate laminated structure 151 being exposed from the spacer 103.

The step of forming the unit dielectric layer 101 and the spacer 103 includes the following steps.

Referring to FIG. 12, a unit dielectric material layer 104 is formed, the unit dielectric material layer 104 covering the first gate laminated structure 150, the second gate laminated structure 151, and the substrates 100 exposed from the first gate laminated structure 150 and the second gate laminated structure 151; and the unit dielectric material layer 104 higher than tops of the first gate laminated structure 150 and the second gate laminated structure 151 and the unit dielectric material layer 104 on the substrate 100 in the peripheral region II are removed.

Referring to FIG. 13 to FIG. 14, a portion of the unit dielectric material layer 104 (shown in FIG. 12) is etched back in thickness to form the unit dielectric layer 101. The unit dielectric layer 101 exposes portions of the side walls of the first gate laminated structure 150 and the second gate laminated structure 151, and the unit dielectric layer 101 located on the side wall of the second gate laminated structure 151 serves as the spacer 103.

As shown in FIG. 13, the method for forming a semiconductor structure further includes: after the unit dielectric material layer 104 on the substrate 100 in the peripheral region II is removed and before the portion of the unit dielectric material layer 104 is etched back in thickness, forming a peripheral dielectric material layer 105 covering the unit memory area I and the peripheral area II; and removing the peripheral dielectric material layer 105 higher than the second gate laminated structure 151 using a planarization process.

The peripheral dielectric material layer 105 is configured to prepare for subsequently forming the peripheral dielectric layer.

The peripheral dielectric material layer 105 is made of a dielectric material. A density of the peripheral dielectric material layer 105 is less than that of the unit dielectric layer 101. In some implementations, the peripheral dielectric material layer 105 is made of silicon oxide. In other implementations, the peripheral dielectric material layer 105 may also be made of borophospho silicate glass (BPSG) or phosphosilicate glass (PSG).

Accordingly, the peripheral dielectric material layer 105 is formed using a high aspect ratio process (HARP). In a flowable chemical vapor deposition process, a filling capability is good, and space enclosed by the second gate laminated structure 151 and the substrate 100 has a relatively large depth. The flowable chemical vapor deposition process is suitable for filling high aspect ratio space, so that a probability of forming defects such as voids formed in the peripheral dielectric material layer 105 is reduced, thereby helping improve film formation quality of the peripheral dielectric layer. In other implementations, the peripheral dielectric material layer 105 may also be formed using a flowable chemical vapor deposition (FCVD) process or a high density plasma chemical vapor deposition (HDPCVD) process.

In some implementations, the planarization process is a chemical mechanical polishing (chemical mechanical planarization, CMP) process. The chemical mechanical polishing process is a global surface planarization technique that can be used to accurately and uniformly remove the peripheral dielectric material layer 105 on the second gate laminated structure 151.

Correspondingly, as shown in FIG. 14, during etching back of the portion of the unit dielectric material layer 104 (shown in FIG. 13) in thickness, a portion of the peripheral dielectric material layer 105 is also etched back in thickness to form the peripheral dielectric layer 106.

The peripheral dielectric layer 106 is configured to electrically isolate the second gate laminated structure 151.

Still referring to FIG. 13, it should be noted that, after the unit dielectric material layer 104 on the substrate 100 in the peripheral region II is removed and before the peripheral dielectric material layer 105 the removed, the method further includes: forming an anti-etching layer 107, the anti-etching layer 107 conformally covering the unit dielectric material layer 104, the first gate laminated structure 150, the second gate laminated structure 151, and the substrate 100 exposed from the spacer 103.

The anti-etching layer 107 is configured to define a position at which etching stops during subsequent formation of a contact hole, thereby reducing a probability of insufficient etching or over-etching in each area. In addition, during removal of the peripheral dielectric material layer 105 higher than the second gate laminated structure 151 using the planarization process, the anti-etching layer 107 is configured to define a position at which the planarization process stops.

In some implementations, the anti-etching layer 107 is made of one or more of silicon nitride, silicon oxynitride, silicon carbide, silicon carbonitride, boron nitride, boron nitride silicon, and boron carbon silicon nitride. In some implementations, the anti-etching layer 107 is made of silicon nitride.

In some implementations, the anti-etching layer 107 further covers the unit dielectric material layer 104 on the side wall of the second gate laminated structure 151.

In some implementations, the anti-etching layer 107 is formed using an atomic layer deposition process. The atomic layer deposition process includes a plurality of atomic layer deposition cycles to form an anti-etching layer 107 of a required thickness. In other implementations, the anti-etching layer may also be formed using other deposition processes such as a chemical vapor deposition process or the like.

It should be noted that, as shown in FIG. 14, during etching back of the portion of the unit dielectric material layer 104 (shown in FIG. 13) in thickness, the anti-etching layer 107 is also etched back.

Referring to FIG. 15 to FIG. 18, an isolation spacer layer 108 (shown in FIG. 18) is formed on a side wall of the unit groove 102, a bottom of the isolation spacer layer 108 contacting with the unit dielectric layer 101, and a top of the isolation spacer layer 108 being lower than a top of the first gate laminated structure 150.

In some implementations, in the step of forming the isolation spacer layer 108 on the side wall of the unit groove 102, the isolation spacer layer 108 is further formed on a portion of a side wall of the second gate laminated structure 151 exposed from the spacer 103. A bottom of the isolation spacer layer 108 contacts with the spacer 103, and the top of the isolation spacer layer 108 is lower than a top of the second gate laminated structure 151.

The isolation spacer layer 108 in the peripheral area II is configured to isolate a subsequently formed metal layer from a second gate laminated structure 151 located at a corner between the second gate laminated structure 151 and the spacer 103, so that a metal silicide layer is unlikely to be formed at the corner between the second gate laminated structure 151 and the spacer 103, and a protruded sharp portion is unlikely to appear, thereby increasing the breakdown voltage of the peripheral region II. Therefore, the electrical performance of the semiconductor structure is improved.

The isolation spacer layer 108 in the peripheral area II and the isolation spacer layer 108 in the unit memory area I have a same height. For detailed descriptions of the isolation spacer layer 108, refer to the corresponding descriptions in the foregoing embodiments and implementations, as details are not described herein again. In some implementations, a height of the isolation spacer layer 108 ranges from 20 nanometers to 30 nanometers.

Figure 15:
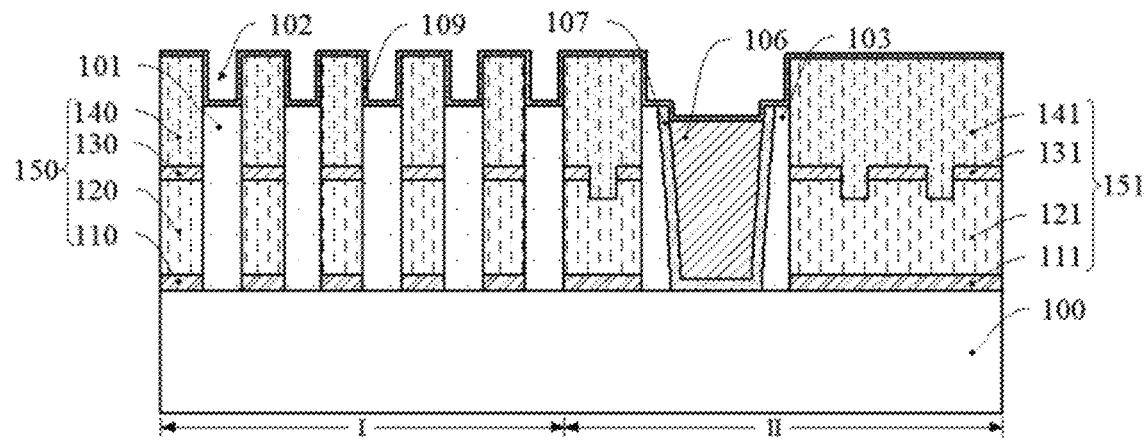

In particular, the step of forming the isolation spacer layer 108 includes:

forming an isolation spacer material layer 109 conformally covering the unit dielectric layer 101 and the first gate laminated structure 150, which is shown in FIG. 15.

The isolation spacer material layer 109 on the side wall of the first gate laminated structure 150 is configured to prepare for subsequently forming the isolation spacer layer located on the side wall of the first gate laminated structure 150.

It should be noted that during formation of the isolation spacer material layer 109 conformally covering the unit dielectric layer 101 and the first gate laminated structure 150, the isolation spacer material layer 109 further conformally covers the second gate laminated structure 151, the spacer 103, and the peripheral dielectric layer 106.

The isolation spacer material layer 109 on the second gate laminated structure 151 is configured to prepare for subsequently forming the isolation spacer layer located on the side wall of the second gate laminated structure 151.

Figure 16:
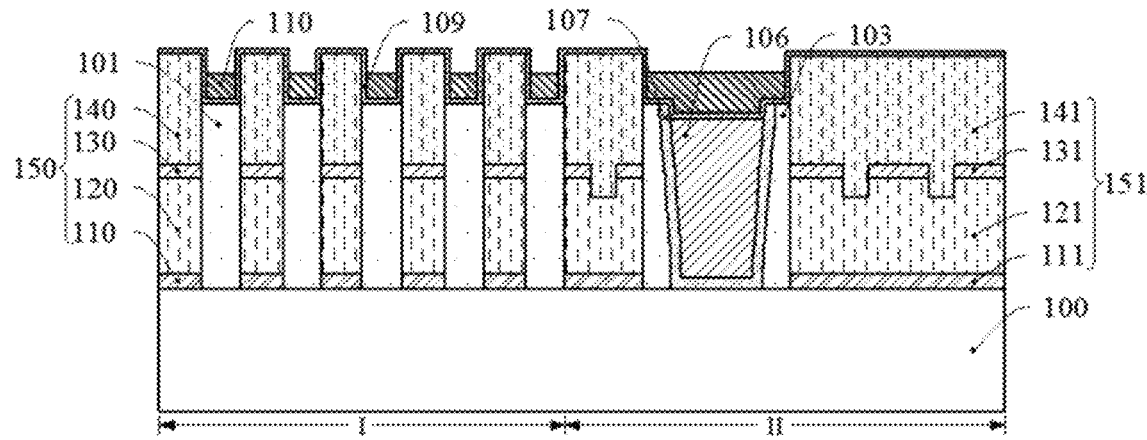

As shown in FIG. 16, after the isolation spacer material layer 109 is formed, a protective layer 110 covering a portion of the side wall of the first gate laminated structure 150 is formed.

The protective layer 110 is configured to define a height of the formed isolation spacer layer. During removal of the isolation spacer material layer 109 higher than the protective layer 110, a damage caused to the isolation spacer material layer 109 can be reduced.

During subsequent removal of the protective layer 110, a rate at which the protective layer 110 is etched is greater than a rate at which the isolation spacer material layer 109, so that a damage caused to a remaining isolation spacer material layer 109 can be reduced.

In some implementations, the protective layer 110 is made of a bottom anti-reflective coating (BARC) material, an organic dielectric layer (ODL) material, and a dielectric anti-reflective coating (DARC) material, a deep UV light absorbing oxide (DUO) material, or an advanced patterning Film (APF) material.

During formation of the protective layer 110 covering the portion of the side wall of the first gate laminated structure 150, the protective layer 110 is further formed in the peripheral area II, and the protective layer 110 in the peripheral area II covers the spacer 103 and exposes a portion of the second gate laminated structure 151 in thickness.

The step of forming the protective layer 110 includes: forming a protective material layer (not labeled) in the unit memory area I and the peripheral area II; and etching back a portion of the protective material layer in thickness, a remaining protective material layer serving as a protective layer, and portions of the side walls of the first gate laminated structure 150 and the second gate laminated structure 151 being exposed from the protective layer.

In some implementations, the protective material layer is formed using a spin coating process, and a surface of the protective material layer has a relatively high plainness.

Figure 17:
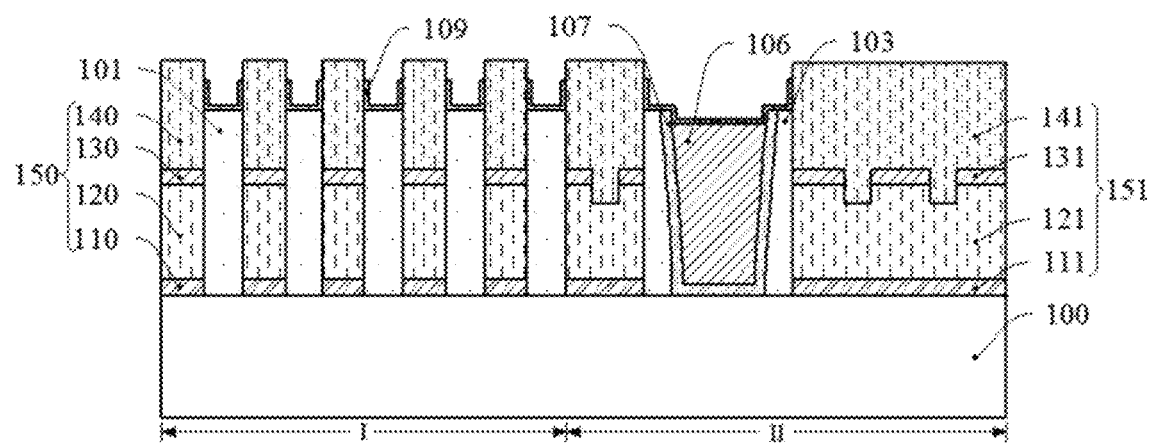

As shown in FIG. 17, the isolation spacer material layer 109 exposed from the protective layer 110 (shown in FIG. 16) is removed.

In some implementations, the isolation spacer material layer 109 exposed from the protective layer 110 is removed using an isotropic etching process. In the isotropic etching process, the control gate layer 140 exposed from the protective layer 110 and the spacer material layer 109 on a side wall of the top polysilicon layer 141 are unlikely to remain.

In some implementations, the isolation spacer material layer 109 is made of silicon oxide. In particular, the isolation spacer material layer 109 exposed from the protective layer 110 is removed using HF gas.

During removal of the isolation spacer material layer 109 exposed from the protective layer 110, a probability of causing a damage to the isolation spacer material layer 109 covered by the protective layer 110 is relatively low.

The method of forming a semiconductor structure further includes: after the isolation spacer material layer 109 exposed from the protective layer 110 is removed, removing the protective layer 110. In some implementations, the protective layer 110 is removed using an ashing process. The ashing process is a frequently used in a semiconductor process, and is not described in detail herein.

Figure 18:
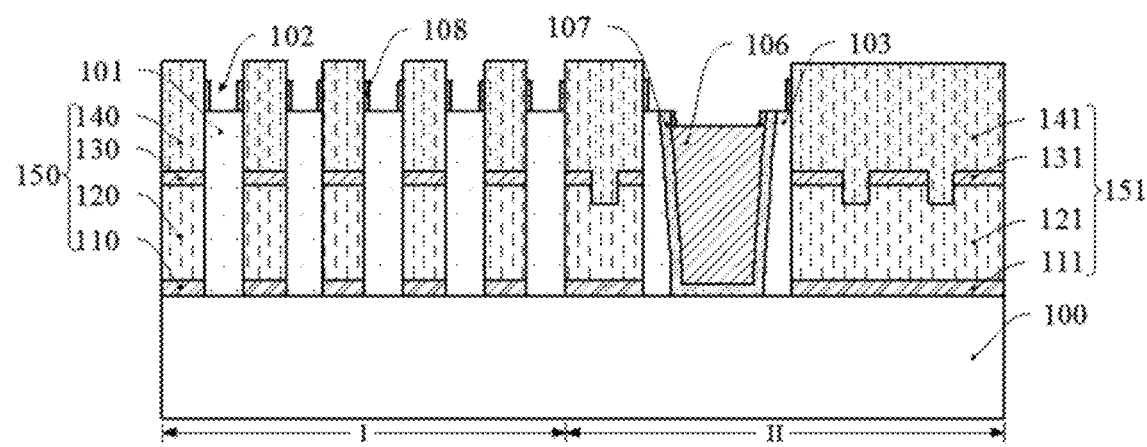

As shown in FIG. 18, after the protective layer 110 is removed, the isolation spacer material layer 109 on the unit dielectric layer 101 is removed using an anisotropic etching process, a remainder of the isolation spacer material layer 109 located on the side wall of the unit groove 102 serving as the isolation spacer layer 108.

The anisotropic etching process is a dry etching process. During etching, the unit dielectric layer 101 is used as an etch stop layer.

In some implementations, the isolation spacer material layer 109 on the unit dielectric layer 101 is removed using a maskless dry etching process. A mask is not required in a step of the maskless etching process, so that process costs are reduced.

It should be noted that, during the anisotropic etching process, the isolation spacer material layer 109 on the spacer 103 is further removed, and a remaining isolation spacer material layer 109 located on the side wall of the second gate laminated structure 151 also serves as the isolation spacer layer 108.

It should be further noted that during removal of a remaining isolation spacer material layer 109 on the unit dielectric layer 101, the isolation spacer material layer 109 on the peripheral dielectric layer 106 is further removed.

Figure 19:
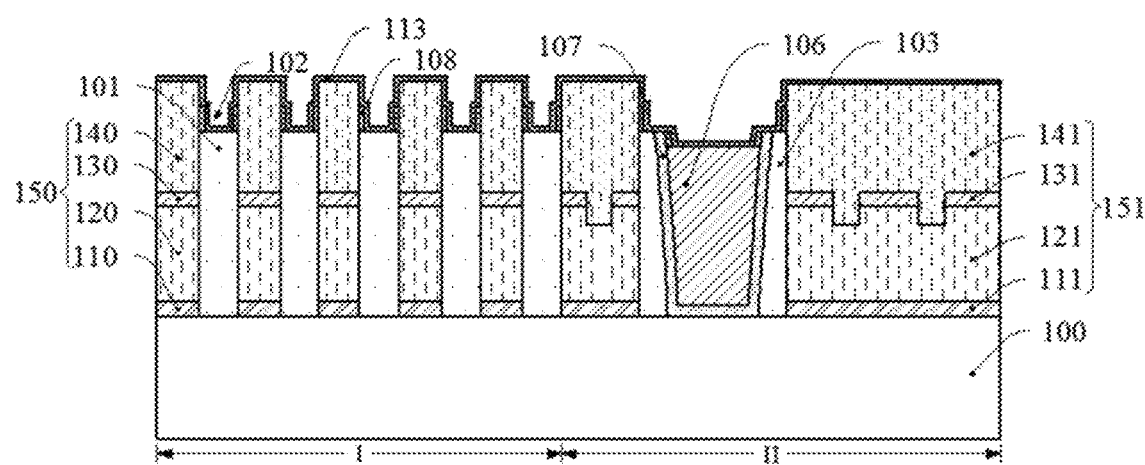

Referring to FIG. 19, a metal layer 113 conformally covering the isolation spacer layer 108, the first gate laminated structure 150, and the unit dielectric layer 101 is formed.

In some implementations, in the step of forming the metal layer 113, the metal layer 113 further conformally covers the second gate laminated structure 151 and the spacer 103.

For detailed descriptions of the metal layer 113, refer to the corresponding descriptions in the foregoing embodiments and implementations, as details are not described herein again.

Figure 20:
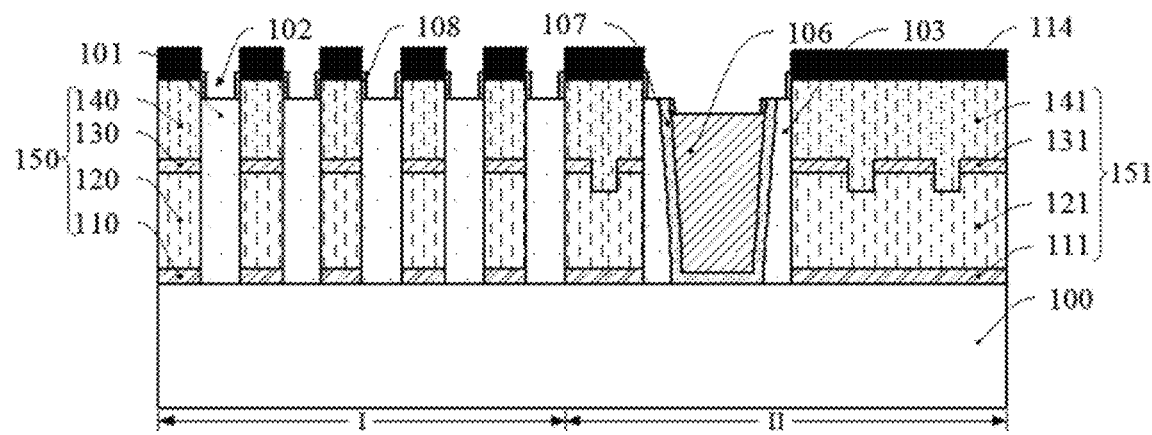

Referring to FIG. 20, the metal layer 113 is annealed to form a metal silicide layer 114.

The metal layer 113 reacts with the control gate layer 140 and the top polysilicon layer 141 to form the metal silicide layer 114.

In some implementations, a remaining select gate and the metal silicide layer 114 serve as a drain select line (DSL) or a source select line (SSL) of the formed NAND flash memory device.

For detailed descriptions of the metal silicide layer 114, refer to the corresponding descriptions in the foregoing embodiments and implementations, as details are not described herein again.

Embodiments and implementations of the present disclosure further provide a semiconductor structure. Referring to FIG. 19, a schematic structural diagram of one form of a semiconductor structure is shown.

The semiconductor structure includes: a substrate 100, the substrate 100 including a unit memory area I; a first gate laminated structure 150 located on the substrate 100 of the unit memory area I; a unit dielectric layer 101 located on the substrate 100 exposed from the first gate laminated structure 150, the unit dielectric layer 101 covering a portion of a side wall of the first gate laminated structure 150, and the unit dielectric layer 101 and the first gate laminated structure 150 enclosing a unit groove 102; an isolation spacer layer 108 located on a side wall of the unit groove 102, a bottom of the isolation spacer layer 108 contacting with the unit dielectric layer 101, and a top of the isolation spacer layer 108 being lower than a top of the first gate laminated structure 150; and a metal layer 113 conformally covering the first gate laminated structure 150, the isolation spacer layer 108, and the unit dielectric layer 101, the metal layer 113 being configured to form a metal silicide layer.

In some implementations, the metal layer 113 is isolated from the first gate laminated structure 150 at a bottom corner of the unit groove 102 through the isolation spacer layer 108, so that a metal silicide layer is unlikely to be formed on the side wall of the first gate laminated structure 150 at the bottom corner of the unit groove 102 during subsequent formation of a metal silicide layer through processing on the metal layer 113, thereby preventing the metal silicide layer from being formed at a corner between the first gate laminated structure 150 and the unit dielectric layer 101. Correspondingly, the metal silicide layer is unlikely to have a protruded sharp portion, thereby helping increase a breakdown voltage of the unit memory area I. Therefore, the electrical performance of the semiconductor structure can be improved.

The substrate 100 provides a process platform for subsequently forming a flash memory. In particular, the substrate 100 is configured to form a nand flash memory device.

In some implementations, related descriptions of the substrate 100 are not described herein again.

In some implementations, the first gate laminated structure 150 includes a first gate insulating layer 110, a floating gate layer 120 located on the first gate insulating layer 110, a first gate dielectric layer 130 located on the floating gate layer 120, and a control gate layer 140 located on the first gate dielectric layer 130. For detailed descriptions of the first gate laminated structure 150, refer to the corresponding descriptions in the foregoing embodiments, and details are not described herein again.

The unit dielectric layer 101 is configured to electrically isolate adjacent first gate laminated structures 150. The unit dielectric layer 101 is further configured to determine a location of the unit groove 102 for providing space for the isolation spacer layer 108.

In particular, the unit dielectric layer 101 is made of at least one of silicon nitride, silicon carbonitride, silicon oxycarbonitride, silicon oxynitride, boron nitride, or boron carbonitride. In some implementations, a material of the bottom dielectric layer 101 includes silicon oxide.

In particular, the unit dielectric layer 101 covers a portion of a side wall of the control gate layer 140.

In some implementations, the isolation spacer layer 108 is made of a dielectric material. The isolation spacer layer 108 is made of one or more of silicon oxide, silicon nitride, silicon oxynitride, silicon carbide, silicon carbonitride, boron nitride, tetraethyl orthosilicate, boron nitride silicon, and boron carbon silicon nitride. In some implementations, a material of the isolation spacer layer 108 includes silicon oxide.

In the unit memory area I, in a lateral direction perpendicular to a direction in which the isolation spacer layer 108 extends, a lateral dimension of a projection of the isolation spacer layer 108 on the unit dielectric layer 101 should be neither excessively large nor excessively small. The step of forming the isolation spacer layer 108 generally includes: forming an isolation spacer material layer 109 conformally covering the unit groove 102 and the control gate layer 140 (shown in FIG. 15), and removing the isolation spacer material layers 109 on a top of the control gate layer 140 and on a bottom of the unit groove 102, a remainder of the isolation spacer material layer 109 on the side wall of the unit groove 102 serving as the isolation spacer layer 108. If the lateral dimension is excessively large, the control gate layer 140 is likely to be damaged during removal of the isolation spacer material layer 109 on the top of the unit groove 102, resulting in poor electrical performance of the semiconductor structure. If the lateral dimension is excessively small, the isolation spacer layer 108 cannot completely isolate the metal layer 113 from the first gate laminated structure 150 at the bottom corner of the unit groove 102. In some implementations, the lateral dimension of the projection of the isolation spacer layer 108 on the unit dielectric layer 101 ranges from three nanometers to five nanometers.

It should be noted that in the unit memory area I, the isolation spacer layer 108 should be neither excessively tall nor excessively short. During subsequent annealing of the metal layer 113, the metal layer 113 located on the side wall of the isolation spacer layer 108 does not react with the first gate laminated structure 150. If the isolation spacer layer 108 is excessively tall, excessive metal layers 113 are likely to be formed on the isolation spacer layer 108, resulting in a formed metal silicide layer with an excessive small thickness. As a result, the semiconductor structure has a relatively large resistance, correspondingly resulting in poor electrical performance of the semiconductor structure. If the isolation spacer layer 108 is excessively short, the isolation spacer layer 108 cannot completely isolate the subsequently formed metal layer 113 from the first gate laminated structure 150 at the bottom corner of the unit groove 102. Consequently, the metal silicide layer subsequently formed at the corner is likely to have a protruded sharp portion, resulting in a relatively low breakdown voltage of the unit memory area I. Consequently, the electrical performance of the semiconductor structure is poor. In some implementations, in the unit memory area I, a height of the isolation spacer layer 108 ranges from 20 nanometers to 30 nanometers.

During subsequent annealing of the metal layer 113, the metal layer 113 reacts with the first gate laminated structure 150 and the second gate laminated structure 151 to form a metal silicide layer.

In some implementations, the metal layer 113 is made of one or more of nickel, titanium, and cobalt.

In some implementations, the substrate 100 further includes a peripheral area II, and the semiconductor structure further includes a second gate laminated structure 151 located on the substrate 100 of the peripheral area II.

The unit dielectric layer 101 is further located on the side wall of the second gate laminated structure 151, the unit dielectric layer 101 on the side wall of the second gate laminated structure 151 serving as the spacer 103, and a portion of the side wall of the second gate laminated structure 151 being exposed from the spacer 103; the isolation spacer layer 108 is further located on the side wall of the second gate laminated structure 151 exposed from the spacer 103; and the metal layer 113 further conformally covers the second gate laminated structure 151 and the isolation spacer layer 108 on the side wall of second gate laminated structure 151.

The isolation spacer layer 108 in the peripheral area II is configured to isolate the metal layer 113 from a second gate laminated structure 151 located at a corner between the second gate laminated structure 151 and the spacer 103, so as to avoid a protruded sharp portion in the peripheral area II, helping increase the breakdown voltage of the peripheral area II. Therefore, the electrical performance of the semiconductor structure is improved.

In the peripheral area II, a height of the isolation spacer layer 108 on the side wall of the second gate laminated structure 151 ranges from 20 nanometers to 30 nanometers.

In some implementations, the second gate laminated structure 151 includes a select gate (SG) located on the substrate 100. The second gate laminated structure 151 includes a second gate insulating layer 111 located on the substrate 100, a bottom polysilicon layer 121 located on the second gate insulating layer 111, a second gate dielectric layer 131 located on the bottom polysilicon layer 121, and a top polysilicon layer 141 located on the second gate dielectric layer 131. Correspondingly, the spacer 103 covers a portion of the side wall of the top polysilicon layer 141.

It should be noted that, in some implementations, that the unit memory area I and the peripheral area II are adjacent areas is used as an example for description. In other implementations, the unit memory area and the peripheral area may also be isolated.

It should be further noted that the semiconductor structure further includes an anti-etching layer 107 located on a side wall of the spacer 103.

The anti-etching layer 107 is made of one or more of silicon nitride, silicon oxynitride, silicon carbide, silicon carbonitride, boron nitride, boron nitride silicon, and boron carbon silicon nitride. In some implementations, the anti-etching layer 107 is made of silicon nitride.

The semiconductor structure further includes a peripheral dielectric layer 106 located on the substrate 100 between the second gate laminated structures 151. The peripheral dielectric layer 106 is configured to electrically isolate the second gate laminated structure 151. The peripheral dielectric layer 106 is made of a dielectric material, and a density of the peripheral dielectric layer 106 is less than that of the unit dielectric layer 101. In some implementations, the peripheral dielectric layer 106 is made of silicon oxide. In other implementations, the peripheral dielectric layer may also be made of borophospho silicate glass or phosphosilicate glass.

In some implementations, a top of the peripheral dielectric layer 106 is lower than that of the unit dielectric layer 101. In particular, the peripheral dielectric layer 106 is located on the substrate 100 between anti-etching layers 107.

The semiconductor structure may be formed using the forming method in the foregoing embodiments and implementations, or may be formed using other forming methods.

Although embodiments and implementations of the present disclosure are disclosed above, the embodiments and implementations of the present disclosure are not limited thereto. A person skilled in the art can make variations and modifications without departing from the spirit and scope of the present disclosure. Therefore, the protection scope of the present disclosure should be subject to the appended claims.

What is claimed is:

1. A method for forming a semiconductor structure, comprising:
   providing a substrate comprising:
   a unit memory area, and
   a plurality of discrete first gate laminated structures that are formed on the substrate of the unit memory area;
   forming a unit dielectric layer on a portion of the substrate exposed from a first gate laminated structure of the plurality of discrete first gate laminated structures, where a portion of a side wall of the first gate laminated structure is exposed from the unit dielectric layer, and the first gate laminated structure and the unit dielectric layer enclose a unit groove;
   forming an isolation spacer layer on a side wall of the unit groove, where a bottom of the isolation spacer layer is in contact with the unit dielectric layer, and a top of the isolation spacer layer is lower than a top of the first gate laminated structure;
   forming a metal layer conformally covering the isolation spacer layer, the first gate laminated structure, and the unit dielectric layer; and
   annealing the metal layer to form a metal silicide layer.

2. The method for forming a semiconductor structure according to claim 1, wherein:
   the substrate further comprises a peripheral area, where a discrete second gate laminated structure is formed on the substrate of the peripheral area;
   in the step of forming the unit dielectric layer on a portion of the substrate exposed from the first gate laminated structure, the unit dielectric layer is further formed on a side wall of the second gate laminated structure, where the unit dielectric layer on the side wall of the second gate laminated structure serves as a spacer, and a portion of the side wall of the second gate laminated structure is exposed from the spacer;
   in the step of forming the isolation spacer layer on the side wall of the unit groove, the isolation spacer layer is further formed on a portion of the side wall of the second gate laminated structure exposed from the spacer, and the bottom of the isolation spacer layer is in contact with the spacer; and
   in the step of forming the metal layer, the metal layer also conformally covers the second gate laminated structure and the spacer.

3. The method for forming a semiconductor structure according to claim 1, wherein the step of forming the isolation spacer layer comprises:
   forming an isolation spacer material layer conformally covering the unit dielectric layer and the first gate laminated structure; and
   removing the isolation spacer material layers on the unit dielectric layer and on the top and a portion of the side wall of the first gate laminated structure using an anisotropic etching process, where a remainder of the isolation spacer material layer located on the side wall of the unit groove serves as the isolation spacer layer.

4. The method for forming a semiconductor structure according to claim 3, wherein the isolation spacer material layer is formed using an atomic layer deposition process, a high temperature oxidation process, a low pressure chemical vapor deposition process, or a low pressure furnace tube process.

5. The method for forming a semiconductor structure according to claim 3, wherein the anisotropic etching process is a dry etching process.

6. The method for forming a semiconductor structure according to claim 1, wherein the step of forming the isolation spacer layer comprises:
   forming an isolation spacer material layer conformally covering the unit dielectric layer and the first gate laminated structure;
   after the isolation spacer material layer is formed, forming a protective layer covering a portion of the side wall of the first gate laminated structure;
   removing the isolation spacer material layer exposed from the protective layer;
   after the isolation spacer material layer exposed from the protective layer is removed, removing the protective layer; and
   after the protective layer is removed, removing the isolation spacer material layers on the unit dielectric layer using an anisotropic etching process, where a remainder of the isolation spacer material layer located on the side wall of the unit groove serves as the isolation spacer layer.

7. The method for forming a semiconductor structure according to claim 6, wherein the isolation spacer material layer exposed from the protective layer is removed using an isotropic etching process.

8. The method for forming a semiconductor structure according to claim 6, wherein the first protective layer is made of a bottom anti-reflective coating (BARC) material, an organic dielectric layer (ODL) material, and a dielectric anti-reflective coating (DARC) material, a deep UV light absorbing oxide (DUO) material, or an advanced patterning film (APF) material.

9. The method for forming a semiconductor structure according to claim 1, wherein in a lateral direction perpendicular to a direction in which the isolation spacer layer extends, a lateral dimension of a projection of the isolation spacer layer on the unit dielectric layer ranges from three nanometers to five nanometers.

10. The method for forming a semiconductor structure according to claim 1, wherein a height of the isolation spacer layer ranges from 20 nanometers to 30 nanometers.

11. The method for forming a semiconductor structure according to claim 1, wherein the isolation spacer layer is made of at least one of silicon oxide, silicon nitride, silicon oxynitride, silicon carbide, silicon carbonitride, boron nitride, tetraethyl orthosilicate, boron nitride silicon, or boron carbon silicon nitride.

12. The method for forming a semiconductor structure according to claim 1, wherein the metal layer is formed using a physical vapor deposition process or an atomic layer deposition process.

* * * * *